US006583673B2

(12) United States Patent
Ahl et al.

(10) Patent No.: US 6,583,673 B2
(45) Date of Patent: Jun. 24, 2003

(54) STABILITY ENHANCED MULTISTAGE POWER AMPLIFIER

(75) Inventors: Bengt Ahl, Gavle (SE); Prasanth Perugupalli, Tempe, AZ (US); Larry Leighton, Scottsdale, AZ (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/794,803

(22) Filed: Feb. 26, 2001

(65) Prior Publication Data

US 2002/0118068 A1 Aug. 29, 2002

(51) Int. Cl.[7] .................................................. H03F 3/04
(52) U.S. Cl. ........................ 330/310; 257/329; 257/331; 330/277; 330/307; 330/311
(58) Field of Search ................................. 330/277, 307, 330/310, 311; 257/329–334

(56) References Cited

U.S. PATENT DOCUMENTS

| 3,323,071 | A | * | 5/1967 | Mitchell ..................... 330/307 |
| 3,384,792 | A | * | 5/1968 | Kazan et al. |
| 3,735,208 | A | * | 5/1973 | Roswell et al. ............. 257/782 |
| 4,823,176 | A | * | 4/1989 | Baliga et al. ............... 257/335 |
| 5,574,402 | A | * | 11/1996 | Nakajima et al. .......... 330/277 |
| 6,177,834 | B1 | * | 1/2001 | Blair et al. ................. 257/341 |

* cited by examiner

Primary Examiner—Michael B Shingleton
(74) Attorney, Agent, or Firm—Baker Botts L.L.P.

(57) ABSTRACT

A multistage power amplifier circuit with superior isolation between gain stages provides alternative common lead currents paths from the individual gain stage elements to obtain improved stability and operational performance.

4 Claims, 4 Drawing Sheets

STABILITY ENHANCED MULTISTAGE POWER AMPLIFIER

FIELD OF INVENTION

The present invention pertains to high gain, high frequency radio frequency (RF) multistage power amplifiers, e.g., used in wireless communication systems.

BACKGROUND

Electronic power devices, for example power transistors, characteristically operate at high current and/or high voltage. These high currents and voltages require that unique considerations be given to the physical design of the devices and their integration into a system. In particular, the higher the power, the greater the affect of electrical lead elements, i.e., the inherent resistive and reactive characteristics of electrical wires and connections, on the performance of the device. For example, high currents carried by power devices may be directed to the common ground path and, thus, may impact the physical arrangement of the power devices to ensure proper grounding for correct circuit operation and circuit stability. In general, the lower the resistance of the electrical paths connecting the power devices to the reference ground terminal, the more accurate and stable the circuit operation.

For high gain, high frequency applications, laterally diffused metal oxide semiconductors ("LDMOS") power transistors have been preferred for forming gain stages in multistage amplifiers. LDMOS transistors have their common element (source) terminal formed on the underside of the transistor die (or "chip"). As such, the transistor source terminals may be directly connected to a common reference lead (e.g., a layer of conductive metal such as gold) formed on a substrate (such as a tungsten or ceramic thermal sink) to which the transistor chip is attached by using known die attach techniques. The LDMOS transistor input (gate) and output (drain) terminals are located on the topside of the transistor chip, and are commonly connected to other circuit elements of the amplifier using bond wires.

In a multistage amplifier, the current flowing through the respective transistor sources is combined in the common reference lead, forming a "common lead current." The common reference lead current path has inherent (parasitic) resistive and reactive elements, which impact on the stability and operational performance of a conventional multistage amplifier. Because of the relatively high common lead current, the inherent resistance and reactance of the common reference lead may substantially affect the operational performance and stability of a multistage amplifier, even though this inherent resistance and reactance of the common reference lead is relatively small.

The "sharing" of a common reference lead by sources of component transistors in multistage amplifiers leads to the problem of isolation degradation between gain stages. Over the years, the general trend has been to make electronic devices, such as cellular telephones, smaller and smaller. As the result, the stages of gain in multistage power amplifiers used in these electronic devices are also being moved closer and closer together. Combined with the presence of inherent resistive and reactive elements in the common reference lead, a feedback voltage results. Consequently, there is an overall isolation degradation between the gain stages of the multistage amplifier, resulting in instability and reduced operational performance.

For purposes of better illustration, FIG. 1 illustrates a physical packaging of a conventional multistage amplifier 100, employing LDMOS transistors for the respective gain stages, and also showing the common lead current paths. FIG. 2 is a schematic illustration of amplifier 100, showing the inherent resistance and inductive reactance of the common reference lead connecting the respective source terminals of the gain stage transistors to reference ground.

The amplifier 100 includes a thermally conductive substrate 140 used as both a heat sink and support structure. The substrate 140 is covered with an electrically conductive material, such as gold, forming an electrically conductive layer 130. A pair of LDMOS power transistor chips 110 and 120 are directly attached to the electrically conductive layer 130, with the respective underlying source terminals of the transistors are directly connected to the conductive layer 130. The transistors 110 and 120 are electrically connected in cascade, with transistor 110 representing the first gain stage, and transistor 120 representing the second gain stage. Although transistors 110 and 120 are illustrated as single transistors, it will be understood by those skilled in the art that each transistor 110 and 120 may actually comprise of two or more physically separate power transistors operating in parallel.

The first gain stage transistor 110 has its top-side gate terminal connected to a gate lead 165 by one or more bond wires 170. The gate lead 165 is attached to (or formed on) the substrate 140, electrically isolated from the conductive layer 130. The gate lead 165 is connected to a source generator 180. The source generator 180 is external to the amplifier device 100, and forms a circuit between the gate lead 165 and the chassis ground 150. Resistance through the source generator 180 is represented by resistor 132.

The top-side drain terminal of transistor 110 is connected to the top-side gate terminal of the second gain stage transistor 120 by one or more bond wires 174. The top-side drain terminal of transistor 120 is connected to a drain lead 163 by one or more further bond wires 172. The drain lead 163 is attached to (or formed on) the substrate 140, electrically isolated from the conductive layer 130. The drain lead 163 is connected to a load, shown as a resistor 182. This resistor 182 is also external to the amplifier device 100.

The underlying side of substrate 140 is attached to a ground plane, e.g., a chassis ground/heat sink 150, with the electrically conductive layer 130 in direct contact with the chassis ground 150. In this manner, the electrically conductive material 130 acts as the common reference lead for the source terminals of transistors 110 and 120, providing a current path from the respective transistor source terminals to chassis ground 150.

In particular, the electrical currents from the respective transistor source terminals combine to form a common lead current (shown by arrows 190), which must contend with the inherent (parasitic) resistance and inductive reactance in the electrically conductive layer 130 (common lead). As a result, the amplifier 100 will generally be unstable and suffer from isolation degradation between its gain stages due, in part, to the close proximity of the transistors 110 and 220 and the inherent resistive and inductive reactance characteristics of the electrically conductive layer 130. Resistors 150, 152, 154, 156, 158 and 160 represent the inherent resistance, and inductors 151, 153, 155, 157, 159 and 161 the inductive reactance, respectively, of the common reference lead current path connecting the transistor source terminals to reference ground. The respective source terminals of transistors 110 and 120 are electrically connected to each other through the respective inherent resistors 152, 154, 156 and 159, and inductors 153, 155, 157 and 159 in the common lead current path. Notably, the inductors are in parallel with the resistors and their inductive reactance is at least equal to the skin resistance of the conductive layer 130 at any given frequency.

Although the inherent resistive and inductive elements may represents very small values, they may cause significant performance variations because of the gains of the individual stages. Further, the resistive and inductive characteristics of the conductive layer can make the current flowing from the source terminal of one transistor flow towards the source terminal of the other transistor. As a result of these factors, a conventional multistage amplifier as illustrated in FIGS. 1 and 2, tends to be unstable and suffers gain stage isolation degradation.

Various approaches have been applied to improve gain stage isolation and to improve the stability of multistage amplifiers. One approach has been to move the active devices (i.e., the power transistors) closer to the ground terminal (i.e., the chassis ground), so that feedback voltage is reduced. For example, when power transistors, such as LDMOS transistors, are placed on supporting or thermally conductive material as part of a power amplifying circuitry, via holes filled or plated with electrically conductive material may be formed in the supporting or thermally conductive material. The via holes provide additional multiple current paths from the common reference lead to the ground or chassis ground, which is generally located on the backside of the supporting or thermally conductive material. This approach brings the ground physically closer to the active device, thereby reducing the effects of the inherent (parasitic) elements. Unfortunately this approach also has certain drawbacks, such as relatively high mechanical and reliability costs of the amplifier package.

Another approach has been to use resistive "dissipative" loading of the gain stages. However, the downside of using dissipative loading is that gain and efficiency are reduced. Thus, an alternative approach that provides a reliable and mechanically cost effective means of power amplification remains highly desirable.

SUMMARY OF THE INVENTION

A multistage amplifier comprises two or more power transistors configured to produce superior isolation between gain stages by providing an alternative current path to ground for at least one of the transistor sources, resulting in increased stability and improved operational performance of the amplifier.

In one embodiment, two power transistors are attached to a common mounting substrate and electrically connected in series in a multistage gain configuration. The transistors may be formed on the same, or separate, semiconductor chips attached to the substrate. The substrate is covered by a layer of electrically conductive material, such as gold, which acts as a common reference lead. A source generator is attached at one end of the substrate and is connected to the input terminal of a first transistor. The output terminal of the first transistor is connected to the input terminal of the second transistor. The output terminal of the second transistor is connected to a load resistance, thereby completing the amplifier circuit.

In accordance with the invention, the common element terminal of the first transistor is isolated from direct electrical connection to the conductive layer (common element lead) and is instead connected by one or more bond wires through the topside of the transistor to the conductive layer at a location near the input of the source generator and distant from the second transistor. The common element terminal of the second transistor is directly connected to the conductive layer (common reference lead) at the bottom of the transistor, in a conventional fashion.

Connecting the respective transistor common element terminals at relatively distant points on the common reference lead results in distinct ground current paths for each transistor, which decreases the total current flow at any one point in the common element lead. This, in turn, increases the mutual resistance and inductive reactance between the gain stages, and provides increased stability for the amplifier device.

Other and further aspects and advantages of the invention will become apparent in view of the following detailed description of the preferred embodiment.

DETAILED DESCRIPTION OF A PREFERRED EMBODIMENT

The present invention provides for a more stable multistage amplifier by providing better isolation between the individual gain stages. This is accomplished by providing an alternative current path from one or more of the source terminals of component transistors to ground or ground chassis. In a preferred embodiment, isolation between the gain stages of a multistage amplifier is achieved by disconnecting the source terminal of a gain stage from its normal connection point to the common reference lead, which is typically under the transistor chip, and reconnecting the source to the common reference lead at the input of the source generator.

Figure 3:
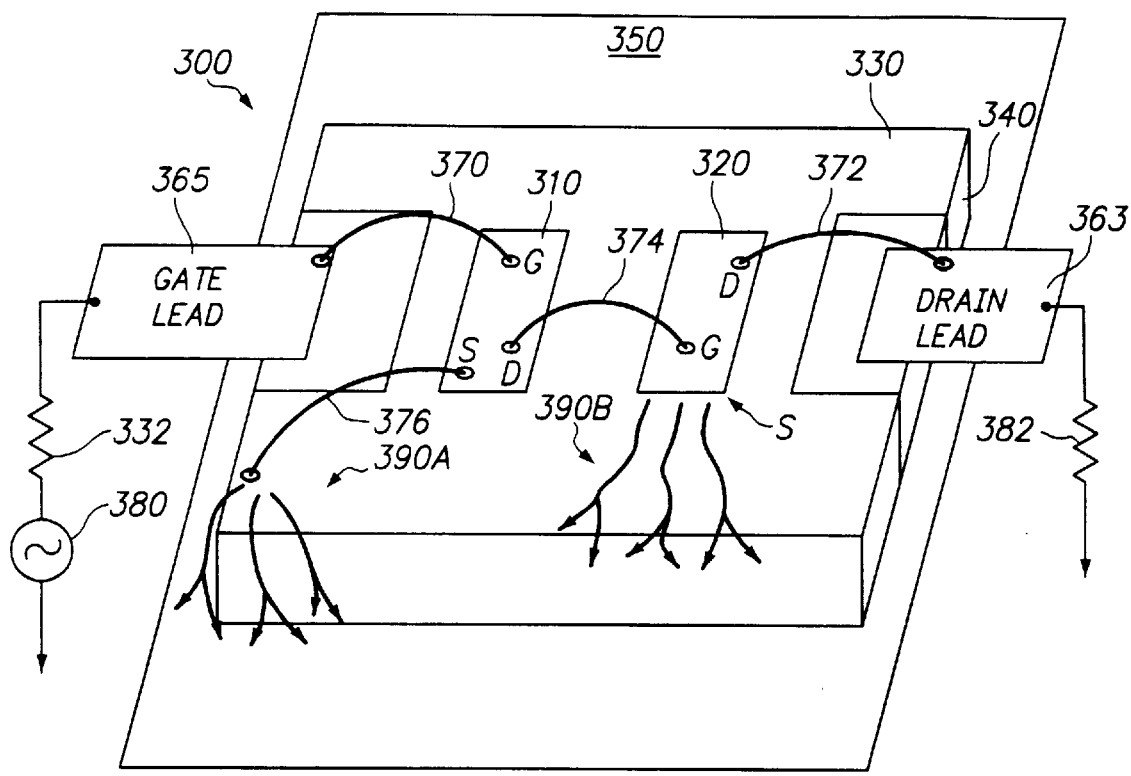
FIG. 3 illustrates a preferred embodiment of a multistage amplifier constructed in accordance with the present invention.

Referring to FIG. 3, an isometric view of a preferred a two-stage amplifier package is shown, with the circuit schematic of the common lead current path, resistive load and source generator of the amplifier circuit laid on top of the isometric view. As with the prior art amplifier 100, amplifier 300 includes a thermally conductive substrate 340 used as both a heat sink and support structure. The substrate 340 is covered with an electrically conductive material, such as gold, forming an electrically conductive layer 330. A pair of LDMOS power transistor chips 310 and 320 are attached to the substrate 340, and electrically connected in series to form first and second gain stages.

The first gain stage transistor 310 has its top-side gate terminal connected to a gate lead 365 by one or more bond wires 370. The gate lead 365 is attached to (or formed on) the substrate 340, electrically isolated from the conductive layer 330. The gate lead 365 is connected to a source generator 380. The source generator 380 has an input terminal electrically connected to the conductive layer 330 to complete a circuit with the gate lead 365. The top-side drain terminal of transistor 310 is connected to the top-side gate terminal of the second gain stage transistor 320 by one or more bond wires 374. The top-side drain terminal of transistor 320 is connected to a drain lead 363. The drain lead 363 is attached to (or formed on) the substrate 340, electrically isolated from the conductive layer 330. The drain lead 363 is connected to a load, shown as an external resistor 382.

Figure 1:
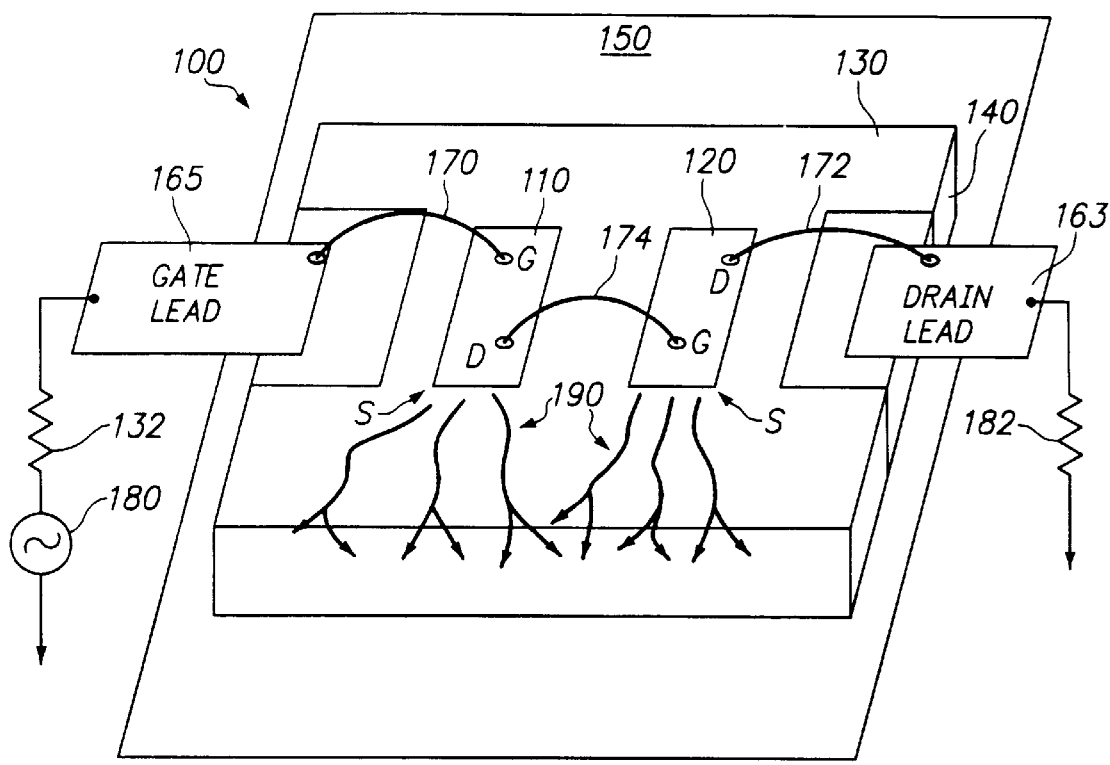
FIG. 1 illustrates a physical packaging of a conventional multistage amplifier, employing LDMOS transistors for the respective gain stages, and also showing the common lead current paths.
Figure 2:
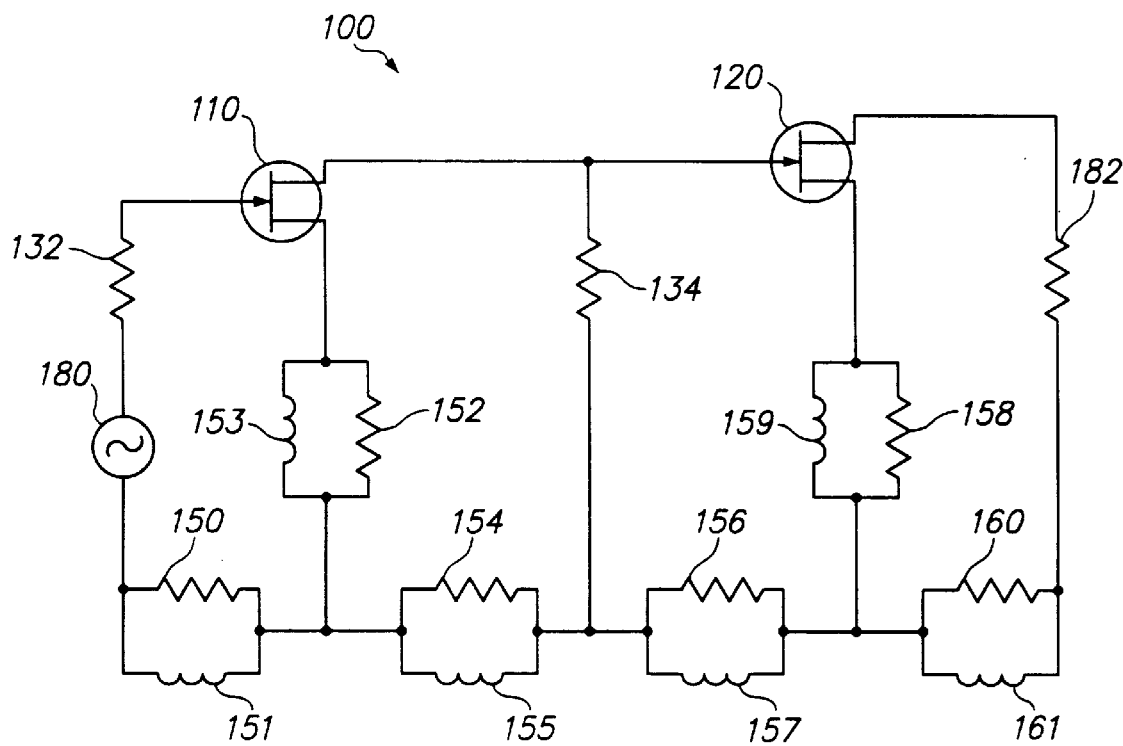
FIG. 2 is a schematic illustration of the amplifier of FIG. 1, showing the inherent resistance and inductive reactance of the common reference lead connecting the respective source terminals of the gain stage transistors to reference ground.

Unlike the prior art amplifier 100 of FIGS. 1 and 2, the underlying source terminal of the first gain stage transistor 310 is insulated from the conductive layer 330 at the point of attachment and is instead connected to the common element lead (i.e., conductive layer 330) via one or more top-side bond wires 376, instead of connecting directly through the bottom of the transistor (or transistor chip) 310. Importantly, the bond wire(s) 376 are connected to the common lead (conductive layer) 330 approximately at the input to the source generator 380 and at a sufficient distance from the from where the source terminal of the second transistor 320 connects to the electrically conductive layer 330 (in this case, underneath the second transistor 320) such that the two respective transistors have distinct ground current paths through the common element lead 330 (as shown by arrows 390A and 390B). In alternate preferred embodiments, the bond wire(s) 376 may be replaced with any other type of conductive element that is electrically insulated from the common lead 330.

In particular, modifying the current path of the first transistor's source current (indicated by arrows 390A in FIG. 3), the current flow is directed away from the second transistor's source current (indicated by arrows 390B), and the common lead current at any one point is thereby substantially diminished. As such, the impact of the inherent resistive and inductive elements in the common reference lead 330 is reduced and superior isolation is obtained between the first and second gain stages, resulting in improved stability and operational performance.

Figure 3A:
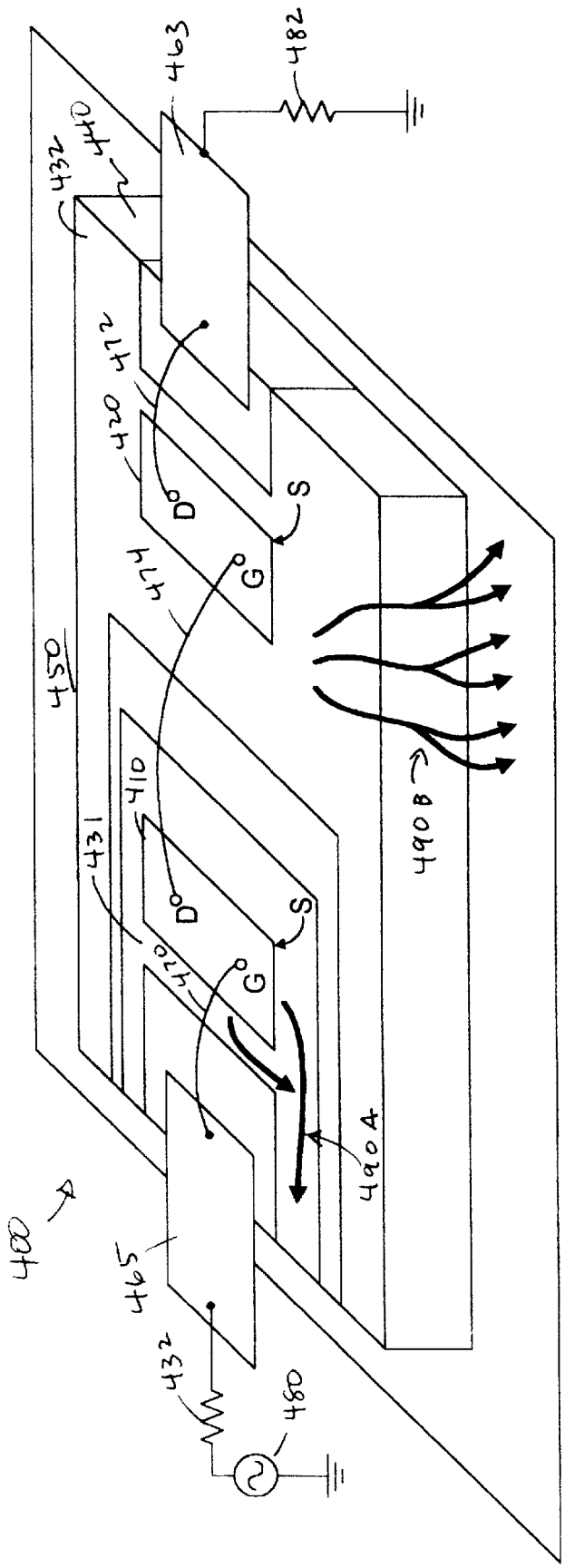
FIG. 3A illustrates another preferred embodiment of a multistage amplifier constructed in accordance with the present invention.

Referring to FIG. 3A, in an alternate preferred embodiment, the bond wire(s) 476 of FIG. 3 have been replaced with an input conductive element for connecting to the source of an input transistor to complete the circuit with a source generator. An isometric view of amplifier 400 includes the thermally conductive substrate 440, the substrate 440 is having an electrically conductive material, such as gold, forming an electrically conductive input layer 431 and output layer 432. A pair of LDMOS power transistor chips 410 and 420 are attached to the substrate 440, and electrically connected in series to form first and second gain stages.

The gate lead 465 is attached to (or formed on) the substrate 440, electrically isolated from the conductive layers 431 and 432. The gate lead 465 is connected to a source generator 480. The source generator 480 has an input terminal electrically connected to the conductive input layer 430 to complete a circuit with the gate lead 465. The top-side drain terminal of transistor 410 is connected to the top-side gate terminal of the second gain stage transistor 420 by one or more bond wires 474. The top-side drain terminal of transistor 420 is connected to a drain lead 463. The drain lead 463 is attached to (or formed on) the substrate 440, electrically isolated from the conductive layers 431 and 432.

The drain lead 463 is connected to a load, shown as an external resistor 482.

Importantly, the conductive input layer 431 is connected to the common lead approximately at the input to the source generator 480 and at a sufficient distance from the from where the source terminal of the second transistor 420 connects to the electrically conductive output layer 432 such that the two respective transistors have distinct ground current paths through a chassis common element lead 450 (as shown by arrows 490A and 490B). Note that transistor 311 is illustrated with a conventional bottom side source, although a skilled practitioner will appreciate that a transistor with a top side source connected by bond wires to input conductive element 331 would function in accordance with this alternate preferred embodiment.

Figure 4:
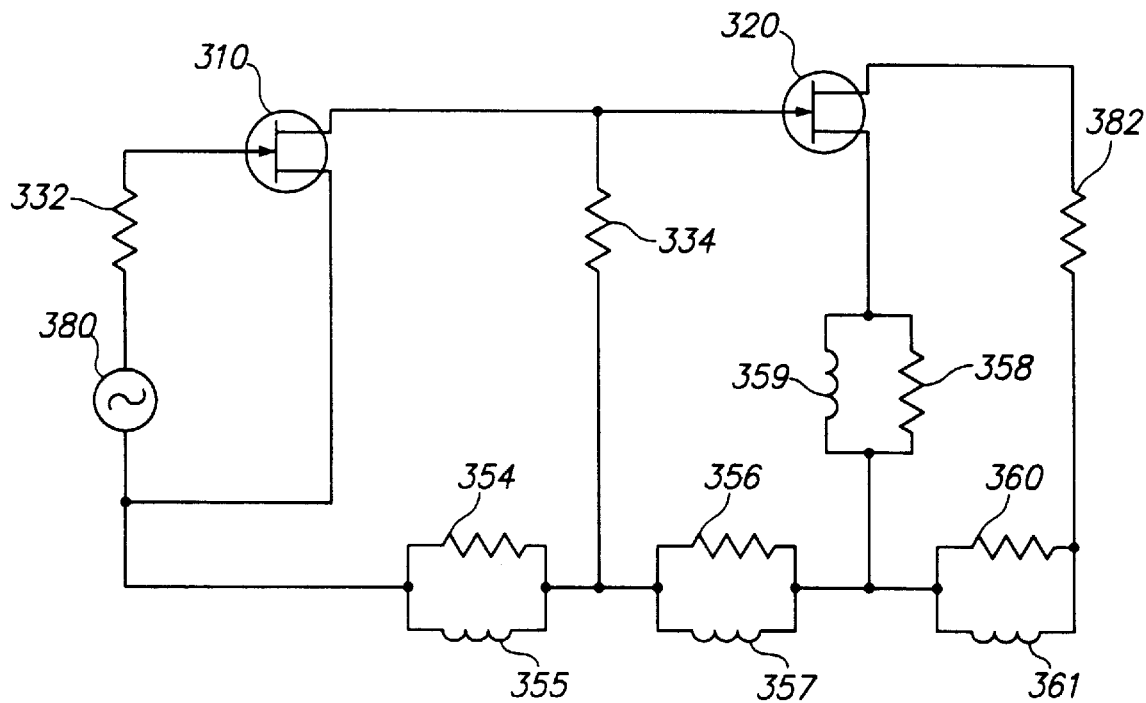
FIG. 4 is a schematic illustration of the amplifier of FIG. 3.

FIG. 4 illustrates an equivalent circuit schematic of the amplifier package of FIG. 3. Notably, the source terminal of the first gain stage transistor 310 must be electrically insulated from the conductive layer underlying the first transistor 310. Since there is no longer a need to have the source terminal connected through the bottom of the transistor chip, LDMOS, or any other type of transistor having a common element terminal located at the bottom of the transistor chip, is not needed as the first gain stage amplifier. Thus, any transistor that provides similar capabilities and can be configured to have its common element terminal coupled to the common reference lead through the topside of the transistor, for example, a MOSFET, may be used as the first gain stage.

Also, the electrical connection connecting the source terminal of the first transistor to the source generator ground may be connected to other locations other than the source generator ground connection. What is important is to provide an alternative current path for the current flowing through the source of the first gain stage such that the current from the source of the first gain stage is "isolated" from the current flowing through the source of the second gain stage and visa versa. By redirecting the current path of the current from the source of one of the gain stages to the input of the source generator, the mutual resistance and reactance between the sources are increased. Since the common reference lead has inherent resistive and reactive characteristics, the mutual resistance and reactance between the gain stages may be increased by increasing the distance between the point where the source terminal of the first gain stage is connected to the common reference lead and the point where the source terminal for the second gain stage is connected to the common reference lead. Thus, by increasing the distance between the connection points of the two sources, isolation between the gain stages improves resulting in superior performance and stability.

Figure 5:
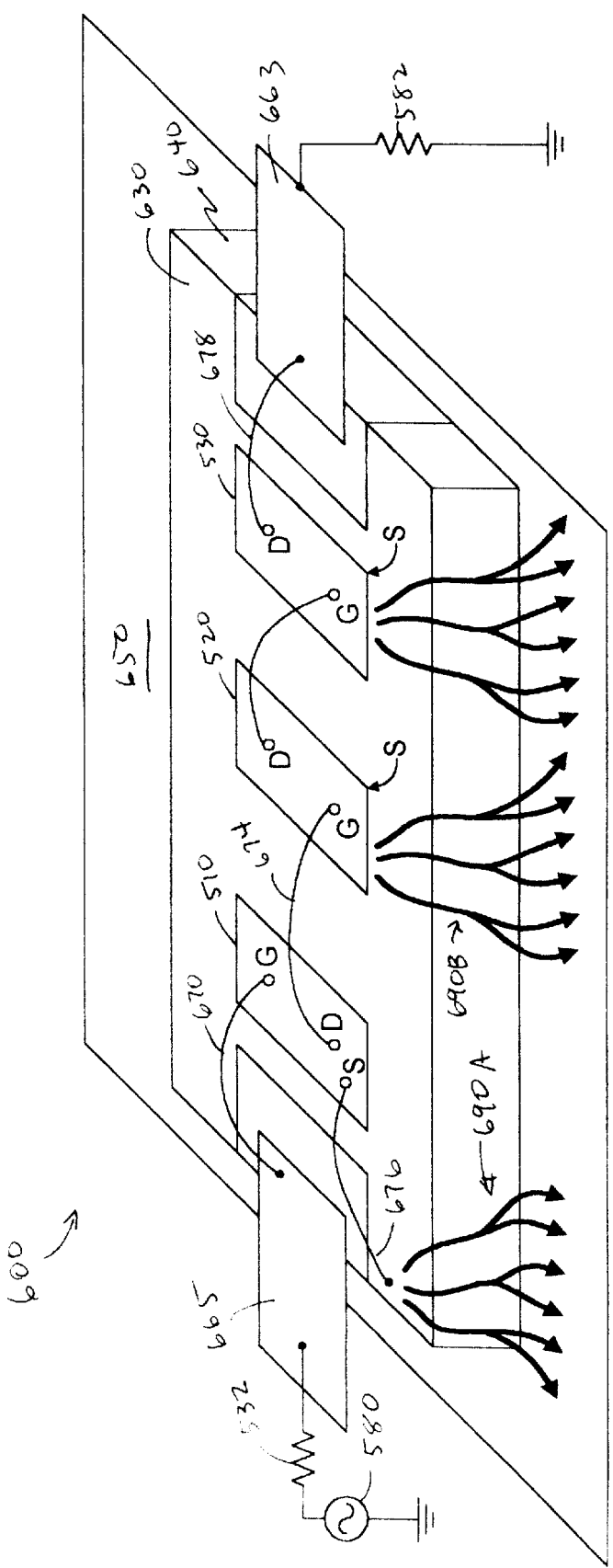
FIG. 5 illustrates another preferred embodiment of a multistage amplifier with three stages constructed in accordance with the present invention.

Referring to FIG. 5, an isometric view of a preferred a three-stage amplifier package is shown, with the circuit schematic of the common lead current path, resistive load and source generator of the amplifier circuit laid on top of the isometric view. As with the prior art amplifier 100, amplifier 600 includes a thermally conductive substrate 640 used as both a heat sink and support structure. The substrate 640 is covered with an electrically conductive material, such as gold, forming an electrically conductive layer 630. Three LDMOS power transistor chips 510, 520 and 530 are attached to the substrate 640, and electrically connected in series to form three gain stages.

The first gain stage transistor 510 has its top-side gate terminal connected to a gate lead 665 by one or more bond wires 670. The gate lead 665 is attached to (or formed on) the substrate 640, electrically isolated from the conductive layer 630. The gate lead 665 is connected to a source generator 580. The source generator 580 has an input terminal electrically connected to the conductive layer 630 to complete a circuit with the gate lead 665. The top-side drain terminal of transistor 510 is connected to the top-side gate terminal of the second gain stage transistor 520 by one or more bond wires 674. The top-side drain terminal of transistor 520 is connected to the top-side gate terminal of the third gain stage transistor 530 by one or more bond wires 672. The top-side drain terminal of transistor 530 is connected to a drain lead 663. The drain lead 663 is attached to (or formed on) the substrate 640, electrically isolated from the conductive layer 630. The drain lead 663 is connected to a load, shown as an external resistor 582.

In particular, modifying the current path of the first transistor's source current (indicated by arrows 690A in FIG. 5), the current flow is directed away from the second and third transistor's source current (indicated by arrows 690B and 690C), and the common lead current at any one point is thereby substantially diminished. As such, the impact of the inherent resistive and inductive elements in the common reference lead 630 is reduced and superior isolation is obtained between the first stage and the subsequent gain stages, resulting in improved stability and operational performance.

Further, while the invention has been described in the context of a preferred embodiment in which the source of the first gain stage transistor is electrically connected distant to the electrical connection of the second gain stage transistor source, the opposite approach may also be employed. For example, in an alternate embodiment, the source terminal of a first gain stage LDMOS transistor is directly connected to the conductive layer in a conventional manner, while the source terminal of a second gain stage LDMOS transistor is connected via an insulated conductor to a point distant the first transistor source connection. For example, the second gain stage transistor source may be electrically connected to the common lead proximate the reference ground return connection of the load circuit.

It will also be apparent to those skilled in the art that the first and second gain stage power transistors may be co-located on the same chip. Further, even though the above embodiments were limited to two stage amplifiers, the teachings of the present invention are applicable to multi-stage amplifiers having more than two stages. Further still, the amplifier circuit may be part of a hybrid circuit wherein some of the components for the multistage amplifier device may not be located on an integrated circuit.

While embodiments and implementations of the subject invention have been shown and described, it should be apparent that many more embodiments and implementations are within the scope of the subject invention. Accordingly, the invention is not to be restricted, except in light of the claims and their equivalents.

What is claimed is:

1. A multistage power amplifier, comprising:
    a substrate having a continuous ground plane formed thereon;
    an input gate lead attached to the substrate and electrically isolated from the continuous ground plane;
    a first gain stage LDMOS transistor die attached to the substrate at a first die attachment location, the first transistor die having a source contact electrically isolated from the continuous ground plane at the first die attachment location, the source contact electrically connected to a top side source contact on the first die, the top side source contact electrically connected by a wire lead to the continuous ground plane at a first die source location near an edge of the substrate in close proximity to the gate input lead; and
    a second gain stage LDMOS transistor die attached to the substrate at a second die attachment location, the second die attachment location in close proximity to the first die attachment location, the second transistor die having a source contact electrically connected to the continuous ground plane at the second die attachment location,
    wherein the first die source and second die attachment locations on the continuous ground plane are sufficiently distant from one another such that the first and second gain stage transistors form substantially separate ground current paths through the continuous ground plane.

2. The amplifier of claim 1, wherein the first die source attachment location is proximate a reference ground connection of an external source generator.

3. The amplifier of claim 1, wherein the second die attachment location is proximate a reference ground connection of a load resistance.

4. The amplifier of claim 1, wherein the amplifier comprises three or more gain stages.

* * * * *